US012671259B2

(12) United States Patent
Edwards et al.

(10) Patent No.: US 12,671,259 B2
(45) Date of Patent: Jun. 30, 2026

(54) OPERATIONS MANAGEMENT OF BATTERY-POWERED DEVICES

(71) Applicant: ITRON, INC., Liberty Lake, WA (US)

(72) Inventors: Bruce Edwards, San Jose, CA (US);
Robert Joseph Strasser, Spokane, WA (US)

(73) Assignee: ITRON, INC., Liberty Lake, WA (US)

( * ) Notice: Subject to any disclaimer, the term of this patent is extended or adjusted under 35 U.S.C. 154(b) by 815 days.

(21) Appl. No.: 17/691,907

(22) Filed: Mar. 10, 2022

(65) Prior Publication Data

US 2023/0291217 A1 Sep. 14, 2023

(51) Int. Cl.
H02J 7/82 (2026.01)
G01R 31/382 (2019.01)

(52) U.S. Cl.
CPC .............. H02J 7/82 (2026.01); G01R 31/382 (2019.01)

(58) Field of Classification Search
CPC ................ G01R 31/382; H02J 7/0048; H04W 52/0206; H04W 52/0296
See application file for complete search history.

(56) References Cited

U.S. PATENT DOCUMENTS

| | | | | |
|---|---|---|---|---|
| 5,631,503 | A | * | 5/1997 | Cioffi ......................... H02J 7/34 307/64 |
| 5,793,187 | A | * | 8/1998 | DeBauche .......... H02J 7/00714 320/135 |
| 10,375,642 | B2 | | 8/2019 | Cornwall et al. |
| 10,757,648 | B2 | * | 8/2020 | Uhling ................... H04W 72/12 |
| 11,251,888 | B1 | * | 2/2022 | Maes ................... H04B 17/336 |
| 11,418,619 | B1 | | 8/2022 | Mattison et al. |
| 11,638,215 | B2 | | 4/2023 | Dusenberry et al. |
| 2004/0232878 | A1 | * | 11/2004 | Couch ...................... H02J 1/14 320/101 |

(Continued)

FOREIGN PATENT DOCUMENTS

| | | |
|---|---|---|
| EP | 2 670 069 A1 | 12/2013 |
| EP | 3 217 714 A1 | 9/2017 |

(Continued)

OTHER PUBLICATIONS

Charoenchaiprakit et al., Optimal Data Transfer of SEH-WSN Node via MDP Based on Duty Cycle and Battery Energy, IEEE, Jun. 15, 2021 (Year: 2021).*

(Continued)

*Primary Examiner* — Kyle R Quigley
(74) *Attorney, Agent, or Firm* — Artegis Law Group, LLP

(57) ABSTRACT

Various embodiments set forth a method comprising determining, by a first computing device powered by a rechargeable battery and a non-rechargeable battery, whether to change operation of the first computing device from a first operating state to a second operating state based on one or more of a state of the rechargeable battery, a state of the non-rechargeable battery, or a state of a communication mode of the first computing device; and in response to determining that operation of the first computing device should change to the second operating state, increasing, by the first computing device, an interval between communications with one or more second computing devices using the communication mode.

20 Claims, 5 Drawing Sheets

(56) References Cited

U.S. PATENT DOCUMENTS

| | | | | |
|---|---|---|---|---|
| 2007/0127346 A1* | 6/2007 | Goodman | ............... | H01M 8/24 |
| | | | | 369/107 |
| 2007/0298822 A1 | 12/2007 | Wan et al. | | |
| 2010/0174928 A1* | 7/2010 | Borghetti | ............. | G06F 9/4893 |
| | | | | 713/320 |
| 2010/0302011 A1* | 12/2010 | Cervinka | .......... | H04W 52/0216 |
| | | | | 340/10.3 |
| 2012/0250538 A1 | 10/2012 | Su et al. | | |
| 2013/0266024 A1 | 10/2013 | Schoppmeier | | |
| 2014/0169281 A1 | 6/2014 | Wang et al. | | |
| 2015/0055594 A1 | 2/2015 | Nirantar et al. | | |
| 2015/0207361 A1* | 7/2015 | Jung | ...................... | G06F 1/3206 |
| | | | | 713/300 |
| 2015/0213709 A1* | 7/2015 | Miller | ............... | H02J 7/007192 |
| | | | | 340/693.2 |
| 2016/0228069 A1 | 8/2016 | Derkx et al. | | |
| 2017/0063127 A1* | 3/2017 | Shelton | ...................... | H02J 3/32 |
| 2017/0063616 A1* | 3/2017 | Klemek | ................... | H04L 41/12 |
| 2017/0074752 A1 | 3/2017 | Pitwon | | |
| 2017/0160734 A1* | 6/2017 | Masse | .................... | G06Q 10/20 |
| 2017/0164314 A1* | 6/2017 | Wylie | ...................... | H04L 67/01 |
| 2017/0256982 A1* | 9/2017 | Kumar K N | ........... | H02J 1/108 |
| 2018/0220373 A1 | 8/2018 | Arzelier et al. | | |
| 2018/0234920 A1 | 8/2018 | Bae | | |
| 2018/0359708 A1 | 12/2018 | Zhao et al. | | |
| 2018/0376427 A1 | 12/2018 | Arzelier et al. | | |
| 2019/0046037 A1 | 2/2019 | Ramesh et al. | | |
| 2019/0055835 A1* | 2/2019 | Brookes | ................... | H04Q 9/02 |
| 2019/0245647 A1 | 8/2019 | Alieiev et al. | | |
| 2019/0320491 A1* | 10/2019 | Shukair | ............... | H04W 72/569 |
| 2020/0112916 A1 | 4/2020 | Dusenberry | | |
| 2020/0252809 A1 | 8/2020 | Patil et al. | | |
| 2020/0396625 A1 | 12/2020 | Sethuraman et al. | | |
| 2021/0144734 A1 | 5/2021 | Rashid et al. | | |
| 2021/0216906 A1 | 7/2021 | Flores et al. | | |
| 2021/0219144 A1 | 7/2021 | Schwengler et al. | | |
| 2021/0385753 A1 | 12/2021 | Kontio et al. | | |
| 2022/0124781 A1 | 4/2022 | Meylan et al. | | |
| 2022/0132622 A1 | 4/2022 | Ahn et al. | | |
| 2022/0210788 A1 | 6/2022 | Dutta et al. | | |
| 2022/0286968 A1 | 9/2022 | Dusenberry et al. | | |
| 2022/0361109 A1* | 11/2022 | Hegde | ............... | H04W 52/0251 |

FOREIGN PATENT DOCUMENTS

| | | | |
|---|---|---|---|
| WO | 2018/138382 A1 | 8/2018 | |
| WO | 2018/192310 A1 | 10/2018 | |

OTHER PUBLICATIONS

Draskovic et al., Optimal Power Management for Energy Harvesting Systems with a Backup Power Source, MECO, Jun. 10, 2021 (Year: 2021).*

Chowdhuri et al., Impact of Pause Time and Mobility on Total Energy Consumption of Nodes, CDAN, 2016 (Year: 2016).*

Varghese et al., Dynamic Duty-Cycled MAC for Wireless Sensor Networks with Energy Harvesters, J4C, 2014 (Year: 2014).*

Ku et al., Data-Driven Stochastic Models and Policies for Energy Harvesting Sensor Communications, IEEE, 2015 (Year: 2015).*

Zhang et al., Data Gathering Optimization by Dynamic Sensing and Routing in Rechargeable Sensor Networks, IEEE, 2016 (Year: 2016).*

Jessen et al., Design Considerations for a Universal Smart Energy Module for Energy Harvesting in Wireless Sensor Networks, IEEE, 2011 (Year: 2011).*

Alfayez et al., A survey on MAC protocols for duty-cycled wireless sensor networks, Elsevier, 2015 (Year: 2015).*

Extended European Search Report for Application No. 21214199.8 dated May 17, 2022.

Notice of Allowance received for U.S. Appl. No. 17/571,389 dated Aug. 21, 2023, 9 pages.

Non Final Office Action received for U.S. Appl. No. 17/127,463 dated Jun. 24, 2022, 14 pages.

Final Office Action received for U.S. Appl. No. 17/127,463 dated Oct. 11, 2022, 20 pages.

Notice of Allowance received for U.S. Appl. No. 17/127,485 dated Aug. 26, 2021, 8 pages.

Mehmood et al., "Power Consumption Modeling of Discontinuous Reception for Cellular Machine Type communications", doi:10. 3390/s19030617, Feb. 1, 2019, 17 pages.

RF Wireless World, "Home of RF and Wireless Vendors and Resources", https://www.rfwireless-world.com/terminology/Difference-between-PSM-and-eDRX-in-GSM-LTE-M-NB-IoT.html, 7 pages.

Notice of Allowance received for U.S. Appl. No. 17/127,485 dated Oct. 4, 2021, 9 pages.

Non Final Office Action received for U.S. Appl. No. 17/127,463, dated Oct. 8, 2021 , 17 pages.

Notice of Allowance received for U.S. Appl. No. 17/127,463 dated Feb. 7, 2022, 8 pages.

Non Final Office Action received for U.S. Appl. No. 17/571,389 dated Feb. 8, 2023, 43 pages.

Non Final Office Action received for U.S. Appl. No. 17/750,186 dated Feb. 2, 2023, 47 pages.

Notice of Allowance received for U.S. Appl. No. 17/127,463 dated Dec. 21, 2022, 10 pages.

Notice of Allowance received for U.S. Appl. No. 17/750,186 dated Oct. 18, 2023, 20 pages.

Non Final Office Action received for U.S. Appl. No. 17/750,186 dated Jun. 9, 2023, 55 pages.

Final Office Action received for U.S. Appl. No. 17/571,389 dated Jun. 29, 2023, 12 pages.

Extended European Search Report for Application No. 23161176.5 dated Jul. 31, 2023.

Extended European Search Report for Application No. 21214198.0 dated May 13, 2022.

Liu et al., "Coverage Enhancement and Fundamental Performance of 5G: Analysis and Field Trial", DOI: 10.1109/MCOM.2019. 1800543, vol. 57, No. 6, Jun. 2019, pp. 126-131.

Andres-Maldonado et al., "An Analytical Performance Evaluation Framework for NB-IoT", DOI:10.1109/JIOT.2019.2915349 , vol. 6, No. 4, Aug. 2019, pp. 7232-7240.

* cited by examiner

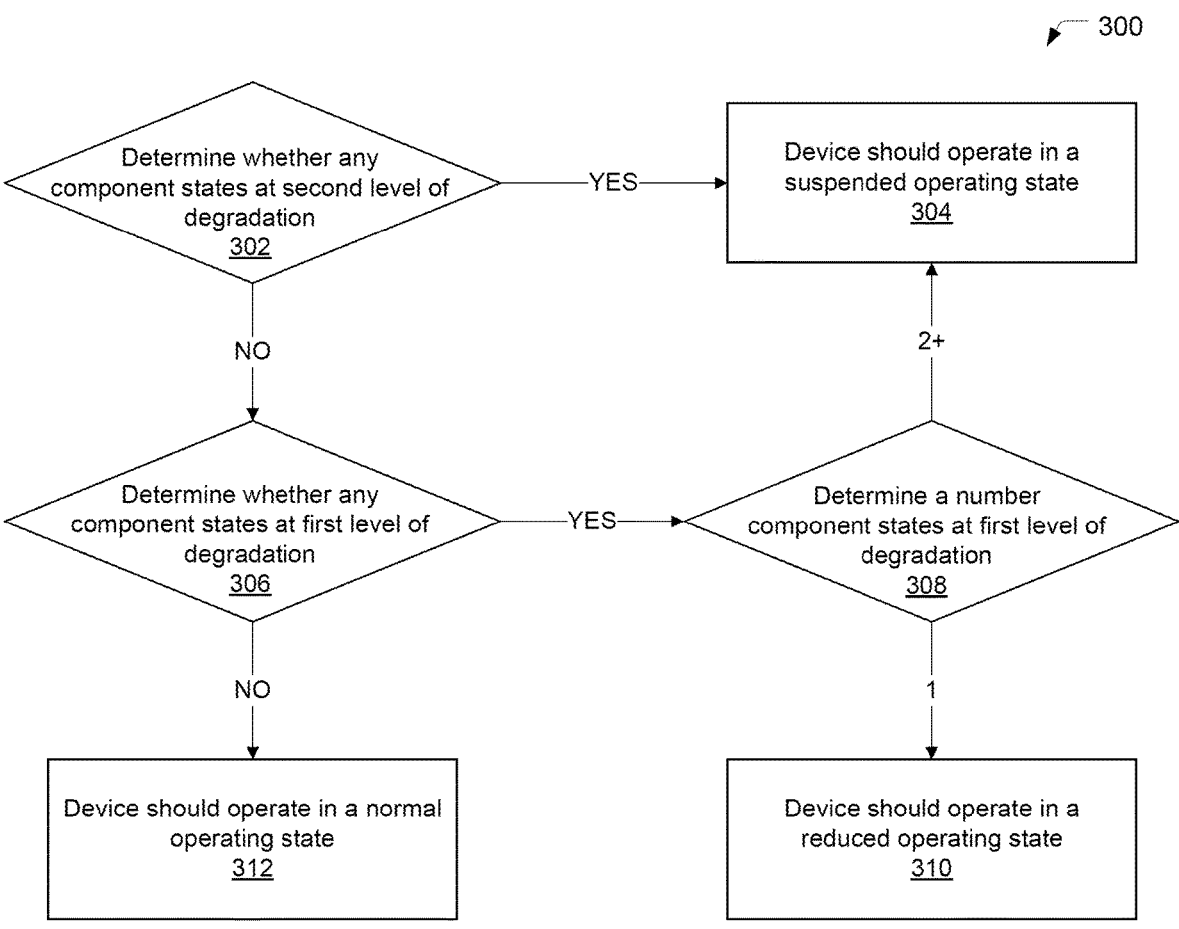

300

Determine whether any component states at second level of degradation
302

YES

Device should operate in a suspended operating state
304

NO

2+

Determine whether any component states at first level of degradation
306

YES

Determine a number component states at first level of degradation
308

NO

1

Device should operate in a normal operating state
312

Device should operate in a reduced operating state
310

FIGURE 3

OPERATIONS MANAGEMENT OF BATTERY-POWERED DEVICES

BACKGROUND

Field of the Various Embodiments

Various embodiments relate generally to wireless devices and, more specifically, to operations management of battery-powered devices.

DESCRIPTION OF THE RELATED ART

A wireless network can include several different types of nodes that are coupled to one another and configured to wirelessly communicate with one another. Two types of nodes included in many wireless networks are mains-powered device (MPD) nodes and battery-powered device (BPD) nodes. MPD nodes are coupled to mains power, such as a power grid, and have continuous access to power when performing various node activities. BPD nodes are powered with battery cells, such as lithium-ion battery cells, and have to perform node activities using only the limited amount of power available through those battery cells.

Some BPD nodes include a combination of a rechargeable battery (e.g., a secondary power cell) that stores harvested energy (e.g., from a solar collector) and a non-rechargeable battery (e.g., a primary power cell). The BPD node utilizes energy harvested from an energy source, such as the sun, to power normal operations of the BPD node and to recharge the rechargeable battery. If the energy consumed by the BPD node exceeds the amount of energy being harvested, then the BPD node also consumes energy from the rechargeable battery. If the energy consumed by the BPD node exceeds both the amount of energy being harvested and the amount of energy stored in the rechargeable battery, then the BPD node consumes energy from the non-rechargeable battery. The energy harvested by the BPD node can vary depending, for example, on the location of the BPD node, the current temperature, the current weather conditions, and the like. Similarly, the energy consumed by the BPD node can vary depending on the strength and stability of the connections of the BPD node to the wireless network, as well as the frequency of communications (i.e., the interval of time between communications) being performed by the BPD node. This variability can cause the BPD node to consume energy from the non-rechargeable battery more quickly than expected, which reduces the operational life of the BPD node or results in the non-replaceable battery needing premature replacement, which is time-consuming and expensive.

BRIEF DESCRIPTION OF THE DRAWINGS

Various embodiments of inventive concepts are disclosed herein with reference to the appended drawings. It is to be noted, however, that the appended drawings illustrate only typical embodiments of the inventive concepts and are therefore not to be considered limiting of scope in any way, and that there are other equally effective embodiments.

FIG. 3 is a flow diagram of method steps for determining a target operating state, according to various embodiments;

DETAILED DESCRIPTION

Figure 1:
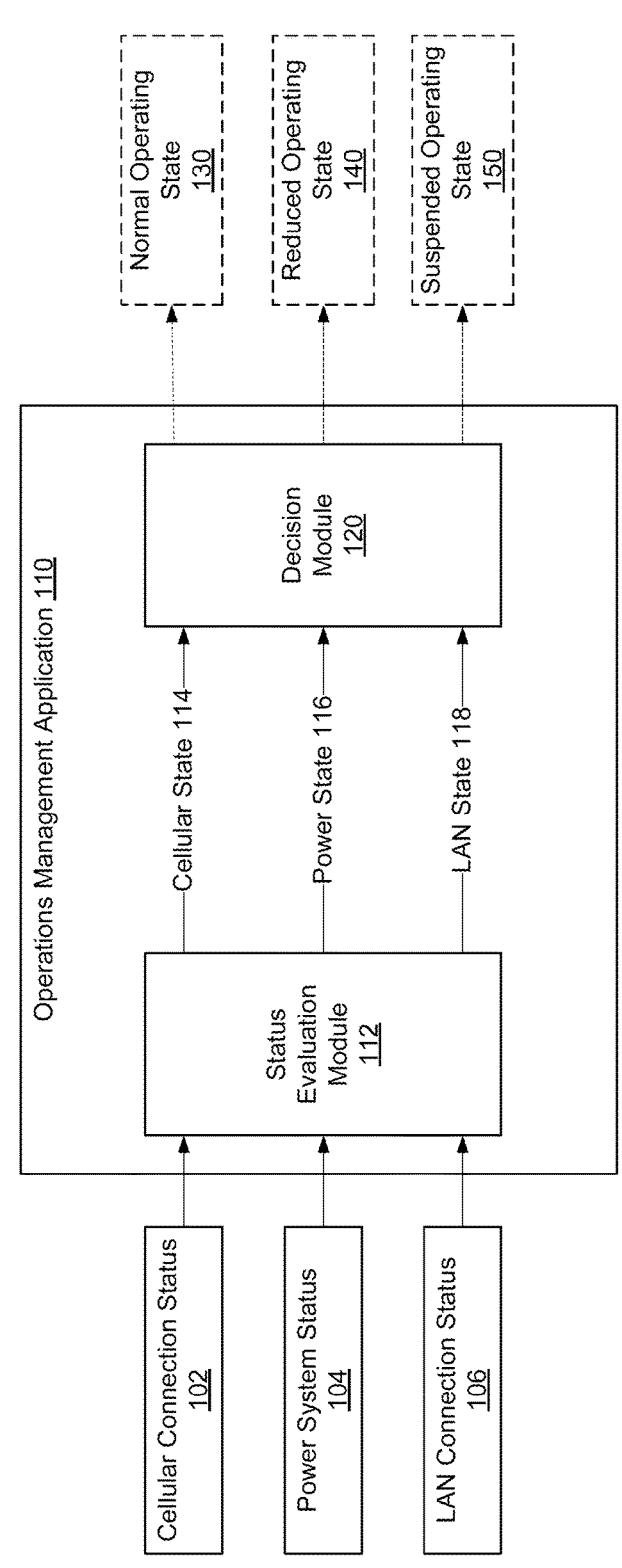
FIG. 1 is a block diagram illustrating an operations management application for managing operating states of a computing device, according to various embodiments.

Some battery-powered devices include a combination of a rechargeable battery that stores harvested energy (e.g., from a solar collector) and a non-rechargeable battery. The battery-powered device prioritizes using energy harvested from an energy source, such as the sun, followed by energy from the rechargeable battery. The battery-powered device does not use the non-rechargeable battery until energy harvested from the energy source is unavailable and the rechargeable battery is depleted. However, if the non-rechargeable battery becomes fully depleted, then when the energy consumed by the battery-powered device exceeds the amount of energy stored in the rechargeable battery, then the battery-powered device would instead be unable to continue to operate.

Battery-powered devices that include a non-rechargeable battery often have a long expected operational life, e.g., twenty years or more, and conserving battery power of the non-rechargeable battery is important for extending the operation life of the battery-powered device. Typical approaches for conserving battery power on a battery-powered device (e.g., mobile phone or tablet) estimate the remaining battery life of the device based on energy consumption characteristics and enter a low-power state when the remaining battery life is below a threshold amount. Because of the variability in both energy consumption and energy harvesting of the battery-powered device at any given time, however, the rate of consumption of energy from the non-rechargeable battery is difficult to predict. Accordingly, the remaining battery life of the non-rechargeable battery is difficult to accurately estimate. Furthermore, for devices with a rechargeable battery, the device typically remains in a low-power state only until the rechargeable battery has been sufficiently recharged. Because the non-rechargeable battery of the battery-powered device cannot be replenished, entering a low-power state when the remaining battery life of the non-rechargeable battery is below a threshold amount does not address the problem of the remaining battery life of the non-rechargeable battery being shorter than the expected operational life of the battery-powered device. Therefore, these approaches are unsuitable for a battery-powered device powered by a non-rechargeable battery.

As discussed below, the above problems can be ameliorated by monitoring the state of the power system and/or communication systems of the battery-powered device. For example, in various embodiments the battery-powered device is configured to determine whether sufficient energy is being harvested, the quality of connections with other nodes in the wireless network, the quality of a connection to a cellular base station, and so forth. In such embodiments, the battery-powered device is operable to determine, based on the state of the power system and/or communication systems, whether to change to a reduced operating state or a suspended operating state, or to resume a normal operating state when in a reduced or suspended operating state.

At least one technical advantage of the disclosed techniques relative to the prior art is that, with the disclosed techniques, the operational life of a device powered by a non-rechargeable battery can be significantly improved. In particular, by monitoring the state of the power system and/or communication systems of the device, the device can enter into an operating state that reduces the consumption of energy stored in the rechargeable battery and thereby reduces the likelihood that the device will need to consume energy stored in the non-rechargeable battery at a later time. Accordingly, using the disclosed techniques, the consumption of energy from the non-rechargeable battery is reduced compared to prior approaches that adjust operation of the device after the non-rechargeable battery has already been consumed. These technical advantages provide one or more technological improvements over prior art approaches.

In the following description, numerous specific details are set forth to provide a more thorough understanding of the various embodiments. However, it will be apparent to one skilled in the art that the inventive concepts may be practiced without one or more of these specific details.

Device Operations Management

In some embodiments, to reduce usage of a non-rechargeable battery, a computing device is configured to monitor the state of the power system of the computing device and determine whether to reduce or suspend various device operations when the power system does not provide sufficient power via a rechargeable battery, solar panel, or other renewable power source. As discussed in further detail below, reducing or suspending device operations include, for example, reducing the amount of communications or suspending communications with a cellular base station and/or with other computing devices via a network, such as a local area network (LAN). By reducing or suspending device operations, the computing device is able to consume less energy while waiting for the power system to regain power (e.g., recharge the rechargeable battery, resume energy collection by a solar panel, and/or the like). Accordingly, the computing device is able to reduce the amount of energy consumed from a non-rechargeable battery or avoid consuming energy from the non-rechargeable battery when the power system is unable to provide sufficient power via a rechargeable battery, solar panel, or other renewable power source.

Additionally, the computing device is configured to monitor the state of other hardware systems of the computing device that consume power, such as communication systems of the computing device in various embodiments. If a hardware system encounters an issue or error during operation of the computing device, the hardware system could consume more energy than normal until the issue or error is resolved. In such cases, the computing device could determine that device operations should be reduced or suspended, even if the power system is providing sufficient power. The device operations that are reduced or suspended could relate to the hardware system that is encountering an issue or error.

As an example, a gateway node is connected to multiple other nodes via LAN connections to the other nodes and/or to a back-office system via a cellular connection. If the gateway node encounters an issue with the LAN connection(s) and/or the cellular connection, such as messages being unsuccessfully transmitted or received, then the gateway node could consume more energy than usual by attempting to re-transmit or re-receive messages. The gateway node could determine that the amount of message transmissions to the cellular base station and/or the other nodes should be reduced (e.g., the interval between message transmissions increased) or communications with the cellular base station and/or the other nodes should be suspended until the issue with the LAN connection(s) and/or cellular connection is resolved. Similarly, if the gateway node encounters an issue with the LAN connection(s) and/or the cellular connection, such as poor or unstable connection quality, then the gateway node could consume more energy than usual by attempting to maintain the LAN connection(s) and/or cellular connection and/or transmit or receive messages via the LAN connection(s) and/or the cellular connection. The gateway node could determine that the LAN connection(s) and/or the cellular connection should be temporarily disconnected or the amount of messages transmitted via the LAN connection(s) and/or the cellular connection should be reduced.

As a result, the computing device can preemptively reduce the amount of energy consumed by the hardware system before the computing device consumes more energy than the power system can provide using the rechargeable battery, solar panel, and/or other renewable power source. Accordingly, the computing device is able to reduce the amount of energy consumed from a non-rechargeable battery or avoid consuming energy from the non-rechargeable battery when a hardware system encounters an issue or error that would normally cause the hardware system to consume additional energy.

FIG. 1 is a block diagram illustrating an operations management application 110 for managing operating states of a computing device 100, according to various embodiments. Operations management application 110 evaluates system status information associated with computing device 100 and determines whether to switch operation of the computing device 100 from a current operating state to a different operating state. As shown in FIG. 1, operations management application 110 includes, without limitation, a status evaluation module 112 and a decision module 120.

In operation, status evaluation module 112 receives status information associated with operation of the computing device 100. The status information indicates the status of different hardware components of computing device 100, such as a rechargeable battery, a non-rechargeable battery, and/or components associated with different communication modes, such as communications via cellular connections and/or local area network (LAN) connections. As shown in FIG. 1, status evaluation module 112 receives, without limitation, cellular connection status 102, power system status 104, and local area network (LAN) connection status 106. In some embodiments, status evaluation module 112 receives status information from one or more components of the computing device 100. For example, status evaluation module 112 could receive power system status 104 from a power system of computing device 100, cellular connection status 102 from a cellular modem included in computing device 100, and/or LAN connection status 106 from one or more transceivers included in computing device 100. In some embodiments, status evaluation module 112 receives status information from one or more applications executing on computing device 100 that monitor, query, or otherwise generate status information for one or more components of computing device 100. For example, status evaluation module 112 could receive power system status 104 from a power system management application, cellular connection status 102 from a cellular communications management application, and/or LAN connection status 106 from a network connection management application.

Cellular connection status 102 includes information indicating a status of one or more cellular connections, such as a connection to a cellular base station or cellular tower. In some embodiments, cellular connection status 102 includes, for each cellular connection, a cellular link quality value indicating a quality of the cellular connection. In some embodiments, cellular connection status 102 includes, for each cellular connection, one or more properties of the connection, such as a signal strength, a signal-to-noise ratio, a bit-error ratio, a connection speed, and/or the like. Status evaluation module 112 computes a cellular link quality value for the connection based on the one or more properties. The cellular link quality value can be computed using any suitable approach or algorithm for assessing the quality of a connection between a computing device and a cellular base station.

Power system status 104 includes information indicating a status of a power system of the computing device 100. In some embodiments, power system status 104 includes information indicating a status of a rechargeable battery included in the power system, a status of a non-rechargeable battery included in the power system, and/or a status of an energy harvesting device, such as a solar panel. The status of the rechargeable battery could include, for example, the amount of energy remaining in the rechargeable battery, the current rate of energy consumption from the rechargeable battery, the current voltage of the rechargeable battery, and/or the like. The status of the non-rechargeable battery could include, for example, the amount of energy remaining in the non-rechargeable battery, the amount of energy consumed from the non-rechargeable battery within a given time period, the amount of time that energy was consumed from the non-rechargeable battery within a given period of time, and/or the like. The status of the energy harvesting device could include, for example, the amount of power being delivered by the energy harvesting device. Additionally, in some embodiments, power system status 104 includes information indicating an amount of power used by the computing device 100 in the current operating state.

LAN connection status 106 includes information indicating a status of one or more LAN connections, such as connections to one or more other computing devices in a network. In some embodiments, LAN connection status 106 includes information indicating a number of computing devices connected to the computing device. In some embodiments, LAN connection status 106 includes, for each connection to another computing device, a LAN connection quality value indicating a quality of the LAN connection. In some embodiments, LAN connection status 106 includes, for each connection to another computing device, one or more properties of the connection, such as a signal strength, a message transmission success rate, a number of messages or packets transmitted within a given time period, a number of messages or packets received within a given time period, and/or the like. Status evaluation module 112 computes a LAN connection quality value for the connection based on the one or more properties. The LAN connection quality value can be computed using any suitable approach or algorithm for assessing the quality of a connection between a pair of computing devices.

Status evaluation module 112 evaluates one or more parameters associated with a component of computing device 100 to determine a state of the device component. As used herein, a "device component" can be a software and/or hardware component. The state of the device component represents the current operating status of the device component. If the device component is operating as expected, or is operating within an expected threshold, then the device component is in a normal operating state. If the device component is not operating as expected, then the device component is in a degraded state. In some embodiments, the state of the device component is one of a normal operating state, a first level of a degraded state, or a second level of a degraded state.

In some embodiments, status evaluation module 112 determines a state of a device component by comparing the value of a parameter associated with the component against one or more threshold values. As example, a normal operating state could be associated with a first minimum value for a given parameter, and a first level of degraded state could be associated with a second minimum value for the given parameter. If the value of the given parameter is above the first minimum value, then the device component is in a normal state. If the value of the given parameter is below the first minimum value but above the second minimum value, then the device component is in a first level of degraded state. If the value of the given parameter is below the second minimum value, then the device component is in a second level of degraded states. A threshold value can be a minimum threshold value or a maximum threshold value, depending on the specific parameter.

In some embodiments, status evaluation module 112 determines a state of a device component by determining whether the value of a parameter associated with the component is a value corresponding to a normal state, a first level of degraded state, or a second level of degraded state.

In some embodiments, status evaluation module 112 determines a state of a device component based on a combination of parameter values. For example, a first level of degraded state could correspond to a first parameter value being below a first threshold value and a second parameter value being above a second threshold value. The specific parameters and other criteria associated with each component state can vary depending on the component.

In some embodiments, determining a state of a device component includes determining one or more external property values, such as a location of the computing device, the current time of day, the current time of year, the current weather conditions, and/or the like. The different threshold values for evaluating a parameter and/or the different values corresponding to each component state can differ based on the location of the computing device, the current time of day, the current time of year, the current weather conditions, and/or the like. In some embodiments, status evaluation module 112 stores configuration data associating different external property values to different evaluation criteria, e.g., threshold values for a parameter or values associated with a component state. In some embodiments, the criteria associated with each component state includes criteria associated with one or more external property values. Status evaluation module 112 evaluates the one or more external property values in conjunction with the one or more properties.

As shown in FIG. 1, status evaluation module 112 evaluates cellular connection status 102, power system status 104, and LAN connection status 106 to generate cellular state 114, power system state 116, and LAN state 118, respectively.

Cellular state 114 represents a current operating state of one or more cellular connections of the computing device 100 to one or more other devices, such as one or more cellular base stations. In some embodiments, a normal cellular state 114 corresponds to robust connections that do not require enhanced modes of communication (which increase energy consumption). A first level of degraded cellular state 114 corresponds to one or more connections being degraded but operating within a given limit. A second level of degraded cellular state 114 corresponds to one or more connections being significantly degraded or no longer connected. As an example, a normal cellular state 114 could correspond to a signal-to-interference-plus-noise ratio (SINR) of 15 dB or more and/or a reference signal received power (RSRP) of −85 dB or more. A first level of degraded cellular state 114 could correspond to an SINR between 0 dB and 5 dB and/or an RSRP between −100 dB and −95 dB. A second level of degraded cellular state 114 could correspond to an SINR less than or equal to 0 dB and/or an RSRP less than or equal to −100 dB.

In some embodiments, status evaluation module 112 determines cellular state 114 based on one or more cellular link quality values. Status evaluation module 112 determines, for each of the cellular link quality values, whether the cellular link quality value is above a threshold value associated with a normal state, below the threshold value associated with the normal state but above a threshold value associated with a first level of degraded state, or below the threshold value associated with the first level of degraded state. In some embodiments, if the computing device 100 has only a single cellular connection, then status evaluation module 112 determines cellular state 114 based on whether the cellular link quality value associated with the cellular connection corresponds to a normal state, first level of degraded state, or second level of degraded state. If the computing device 100 has multiple cellular connections, then status evaluation module determines cellular state 114 based on the number of cellular link quality values that correspond to the normal state, the number of cellular link quality values that correspond to the first level of degraded state, and the number of cellular link quality values correspond to the second level of degraded state. For example, if more than a specified number of cellular link quality values correspond to the second level of degraded state, then status evaluation module 112 determines that cellular state 114 is a second level of degraded state. If no cellular link quality values correspond to the second level of degraded state but more than a specified number of cellular link quality values correspond to the first level of degraded state, then status evaluation module 112 determines that cellular state 114 is a first level of degraded state.

Power system state 116 represents a current operating state of a power system of the computing device 100. In some embodiments, a normal power system state 116 corresponds to one or more solar panels (or other suitable source of harvested energy) delivering the amount of power needed to operate the computing device 100 or more than the amount of power needed to operate the computing device 100, such as additional power to recharge the rechargeable battery. Additionally, in some embodiments, if the one or more solar panels are not delivering the amount of power needed to operate the computing device 100, in the normal power system state 116, the amount of energy stored in the rechargeable battery of the computing device 100 exceeds a threshold amount. For example, the threshold amount of energy could be the amount of energy needed to sustain operations of the computing device 100 until the one or more solar panels can be expected to provide power for operating the computing device 100 or to sustain operations of the computing device 100 for a given period of time (e.g., overnight). In some embodiments, the threshold amount of energy is based on the power usage of the computing device 100, such as an average amount of power usage over a period of time (e.g., a 12-hour period, a day, a week) and a target period of time for sustaining operations of the computing device 100. In some embodiments, the target period of time is determined based on one or more external factors, such as a location of the computing device, the current time of day, the current time of year, the current weather conditions, and/or the like. For example, if the current time of day is after sunset, the period of time could be based on an amount of time between the current time and a calculated sunrise time. As another example, if the current weather condition is cloudy, the period of time could be based on an amount of time between the current time and the next forecasted sunny day.

In some embodiments, a first level of degraded power system state 116 corresponds to the one or more solar panels (or other suitable source of harvested energy) being unavailable for longer than a specified amount of time and/or the one or more solar panels being unavailable and the amount of energy remaining in the rechargeable battery being under the threshold amount. A second level of degraded power system state 116 corresponds to the one or more solar panels being unavailable and the rechargeable battery being depleted, i.e., energy being consumed from a non-rechargeable battery. Status evaluation module 112 determines power system state 116 based on information indicating whether energy is being provided by the one or more solar panels and/or other energy source, the rechargeable battery, or the non-rechargeable battery. Additionally, status evaluation module 112 determines power system state 116 based on information indicating the amount of energy remaining in the rechargeable battery and the amount of time since the one or more solar panels and/or other energy source provided power to the power system.

In some embodiments, a first level of degraded power system state 116 corresponds to energy being consumed from the non-rechargeable battery for more than a first amount of time over a first period of time. For example, the first level of degraded power system state 116 could correspond to consuming energy from the non-rechargeable battery for more than an hour over the last 24 hours. A second level of degraded power system state 116 corresponds to energy being consumed from the non-rechargeable battery for more than a second amount of time over a second period of time. In various embodiments, the second period of time is different (e.g., longer) than the first period of time. For example, the second level of degraded power system state 116 could correspond to consuming energy from the non-rechargeable battery for more than 936 hours over the last 180 days. In some embodiments, the first amount of time, the first period of time, the second amount of time, and/or the second period of time can vary depending on the location of the computing device 100, the current weather conditions, the time of year, and/or the like. For example, a solar panel could be expected to collect less energy during the winter or on cloudy days. The amount of time corresponding to a degraded state given such external conditions could, therefore, be greater than the amount of time for the summer or on sunny days. Status evaluation module 112 determines power system state 116 based on information indicating an amount of time that energy was consumed from the non-rechargeable battery over the first period of time and an amount of time that energy was consumed from the non-rechargeable battery over the second period of time.

LAN state 118 represents a current operating state of one or more connections of the computing device 100 with one or more other computing devices. In some embodiments, a normal LAN state 118 corresponds to each connection having sufficient reliability, such as a message success rate or packet success rate above a given threshold value, an error rate below a given threshold value, and/or a signal quality above a given threshold value. A first level of degraded LAN state 118 corresponds to the number of connections that do not have sufficient reliability, i.e., do not have a message success rate or packet success rate above a given threshold value, an error rate below a given threshold value, and/or a signal quality above a given threshold value, being more a first threshold value but less a second threshold value. A second level of degraded LAN state 118 corresponds to the number of connections that do not have sufficient reliability being more than the second threshold value. In some embodiments, status evaluation module 112 determines LAN state 118 based on one or more LAN connection quality values. Each LAN connection quality value is computed based on one or more properties of the corresponding connection, such as a signal strength, a message transmission success rate, a number of messages or packets transmitted within a given time period, a number of messages or packets received within a given time period, and/or the like. Status evaluation module 112 determines a number of LAN connection quality values that are below a given threshold value. Status evaluation module 112 determines whether the number corresponds to a normal LAN state 118, a first level of degraded LAN state 118, or a second level of degraded LAN state 118. In some embodiments, status evaluation module 112 determines LAN state 118 based on one or more properties of each LAN connection. For example, status evaluation module 112 could determine one or more of whether a message success rate or packet success rate associated with the connection is above a first threshold value, an error rate associated with the connection is below a second threshold value, a signal quality associated with the connection is above a third threshold value, and/or the like.

In some embodiments, a first level of degraded LAN state 118 corresponds to the number of connected computing devices dropping below a first threshold amount (e.g., 50%). A second level of degraded LAN state 118 corresponds to the number of connected computing devices dropping below a second threshold amount (e.g., 20%). Status evaluation module 112 determines a current number of connected computing devices connected via one or more LAN connections and a previous number of connected computing devices connected via the one or more LAN connections. Status evaluation module 112 computes the difference between the current number of connected computing devices and the previous number of connected computing devices. The previous number of connected computing devices could be, for example, the last-retrieved number of connected computing devices, an average number of connected computing devices over a period of time, a highest number of connected computing devices over a period of time, a smallest number of connected computing devices over a period of time corresponding to a normal operating state, and/or the like.

Decision module 120 receives the cellular state 114, power state 116, and LAN state 118 and determines, based on the cellular state 114, power state 116, and LAN state 118, whether the computing device 100 should be in a normal operating state 130, a reduced operating state 140, or a suspended operating state 150. In some embodiments, in normal operating state 130, the computing device 100 operates under usual conditions, without any reduction in device operations or functionality.

In reduced operating state 140, the computing device 100 reduces one or more device operations or functions. For example, in reduced operating state 140, computing device 100 could communicate or connect less frequently with a cellular base station via a cellular connection, transmit messages less frequently to one or more other computing devices via one or more LAN connections, and/or receive messages less frequently from the one or more computing devices. Additionally, in a reduced operating state 140, the computing device 100 could display or transmit one or more alert or status messages. For example, a node could transmit one or more messages indicating that the node is in a reduced operating state to a control center or back office. Additionally, computing device 100 could restart or could reset one or more components.

In suspended operating state 150, computing device 100 suspends one or more device operations or functions. For example, in suspended operating state 150, computing device 100 could stop communicating or connecting via the cellular connection and/or via the one or more LAN connections. Additionally, in a suspended operating state 150, the computing device 100 could display or transmit one or more alert or status messages. For example, a node could transmit one or more messages indicating that the node is entering a suspended operating state to a control center or back office. In some embodiments, in suspended operating state 150, computing device 100 periodically performs the steps discussed above to determine whether the computing device can resume a normal operating state 130 or enter a reduced operating state 140 from suspended operating state 150. In some embodiments, in suspended operating state 150, computing device 100 shuts down after a period of time if the computing device 100 is unable to resume a normal operating state 130 or enter a reduced operating state 140 during the period of time.

In some embodiments, decision module 120 determines whether the computing device 100 should be in a normal operating state 130, a reduced operating state 140, or a suspended operating state 150 based on a number of component states (e.g., cellular state 114, power state 116, and LAN state 118) that are a first level of degraded state and a number of component states that are a second level of degraded state. If no component states are at a first level of degraded state and no component states are a second level of degraded state, then decision module 120 determines that computing device 100 should be in a normal operating state 130. If one component state is a first level of degraded state and no component states are at a second level of degraded state, then decision module 120 determines that computing device 100 should be in a reduced operating state 140. If two or more component states are a first level of degraded state or at least one component state is a second level of degraded state, then decision module 120 determines that computing device 100 should be in a suspended operating state 150.

In some embodiments, if the current operating state is the same as the determined operating state, then computing device 100 does not change operating states. If the current operating state is different from the determined operating state, then operation of the computing device 100 changes to the determined operating state. In some embodiments, the specific operations and functions that are reduced in a reduced operating state 140 or suspended in a suspended operating state 150 are based on the component states that cause decision module 120 to determine that the computing device 100 should be in the reduced operating state 140 or suspended operating state 150.

In some embodiments, if decision module 120 determines that the system should be in a reduced operating state 140 because cellular state 114 is a first level degraded state, then reduced operating state 140 includes reducing an amount of cellular communications, such as increasing an interval of time between transmitting or receiving packets from the one or more cellular base stations and/or an interval of time between attempts to establish a connection to the one or more cellular base stations. If decision module 120 determines that the system should be in a reduced operating state 140 because LAN state 118 is a first level degraded state, then reduced operating state 140 includes reducing an amount of communications with one or more other computing devices, such as increasing an interval between transmitting messages to the one or more other computing devices and/or increasing an interval between listening for message from the one or more other computing devices. If decision module 120 determines that the system should be in a reduced operating state 140 because power state 116 is a first level degraded state, then reduced operating state 140 includes reducing an amount of communications with one or more cellular base stations and/or with one or more other computing devices.

In some embodiments, if decision module 120 determines that the system should be in a suspended operating state 150 because cellular state 114 is a second level degraded state, then suspended operating state 150 includes suspending communications with one or more cellular base stations. If decision module 120 determines that the system should be in a suspended operating state 150 because LAN state 118 is a second level degraded state, then suspended operating state 150 includes suspending communications with one or more other computing devices. If decision module 120 determines that the system should be in a suspended operating state 150 because power state 116 is a second level degraded state, then suspended operating state 150 includes commencing a timed shutdown of different operations followed by a complete shutdown of the computing device 100.

In some embodiments, if the current operating state is the same as the determined operating state, but the operations that should be reduced or suspended for the determined operating state differ from the operations that were reduced or suspended for the current operating state, the computing device 100 does not switch operating states but instead reduces or suspends the operations for the determined operating state. Additionally, computing device 100 could resume normal operation of the operations that were previously reduced or suspended. For example, if decision module 120 determines that the operating state should be reduced operating state 140 and the amount of LAN communications should be reduced, and the current operating state is also reduced operating state 140 but the amount of cellular communications is currently being reduced, computing device 100 remains in reduced operating state 140 and reduces the amount of LAN communications. Optionally, computing device 100 also resumes the normal (non-reduced) amount of cellular communications, such as decreasing the interval between cellular communications.

In various embodiments, operations management application 110 includes more or fewer components than illustrated in FIG. 1. Although FIG. 1 illustrates status evaluation module 112 as a single component of operations management application 110, in some embodiments, status evaluation module 112 can be multiple modules or application and/or can be separate from operations management application 110. For example, a first module or application could receive cellular connection status 102 and generate cellular state 114, a second module or application could receive power system status 104 and generate power state 116, and a third module or application could receive LAN connection status 106 and generate LAN state 118. Furthermore, in some embodiments, functionality of status evaluation module 112 and decision module 120 can be combined into a single module. In such embodiments, the module can receive system status information and determine an operating state for the computing device 100 without specifically generating a device component state (e.g., cellular state 114, power state 116, LAN state 118).

Additionally, although FIG. 1 illustrates three device components, three types of component states, and three types of operating states, any suitable number of components, component states, and/or operating states can be used.

Figure 2:
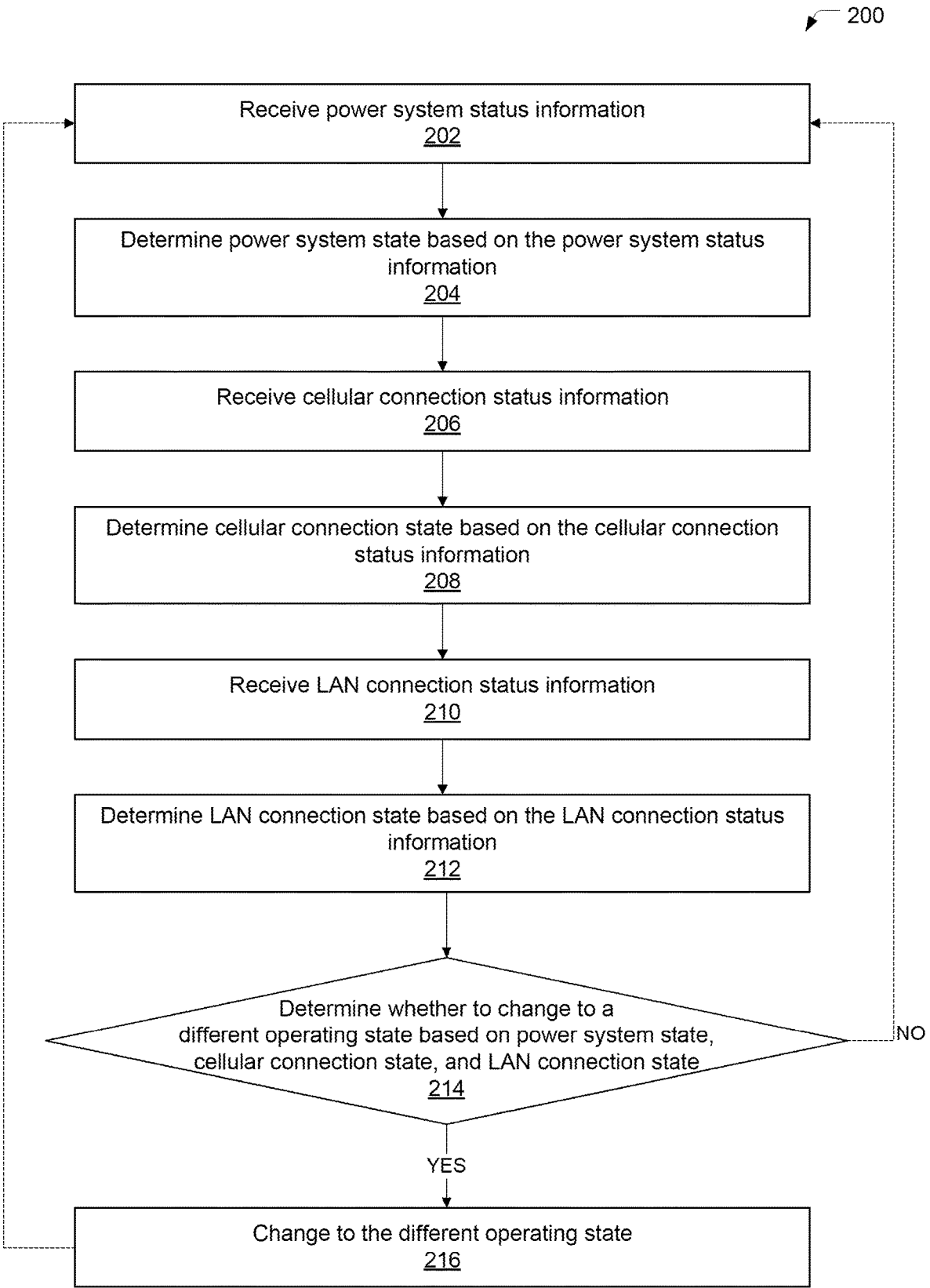
FIG. 2 is a flow diagram of method steps for determining whether to change operation of a computing device to a different operating state, according to various embodiments.

FIG. 2 is a flow diagram of method steps 200 for determining whether to change operation of a computing device to a different operating state, according to various embodiments. Although the method steps are described with reference to the computing device of FIG. 1, persons skilled in the art will understand that any system configured to implement the method steps, in any order, falls within the scope of the present invention.

As shown in FIG. 2, a method 200 begins at step 202, where an operations management application receives power system status information. For example, operations management application 110 receives power system status 104. In some embodiments, the power system status information includes information indicating a status of a rechargeable battery included in the power system, a status of a non-rechargeable battery included in the power system, and/or a status of an energy harvesting device such as a solar panel.

At step 204, the operations management application determines a power system state based on power system status information. For example, operations management application 110 determines a power system state 116 based on power system status 104. Determining a power system state is performed in a manner similar to that described above with respect to status evaluation module 112 and power system state 116.

In some embodiments, a first level of degraded power system state corresponds to one or more energy sources being unavailable for longer than a specified amount of time and/or the one or more energy sources being unavailable and the amount of energy remaining in the rechargeable battery being under a threshold amount. A second level of degraded power system state corresponds to the one or more energy sources being unavailable and the rechargeable battery being depleted. The operations management application determines, based on the power system status information, whether the one or more energy sources are available, an amount of energy being collected by the one or more energy sources, and the amount of energy remaining in the rechargeable battery. Operations management application determines whether the power system state is a normal state, a first level of degraded state, or a second level of degraded state based on whether the one or more energy sources are available, an amount of energy being collected by the one or more energy sources, and the amount of energy remaining in the rechargeable battery.

In some embodiments, a first level of degraded power system state corresponds to energy being consumed from a non-rechargeable battery for more than a first threshold amount of time over a first period of time and a second level of degraded power system state 116 corresponds to energy being consumed from the non-rechargeable battery for more than a second threshold amount of time over a second period of time. The operations management application determines, based on the power system status information, a first amount of time that energy was consumed from the non-rechargeable battery over the first period of time and a second amount of time that energy was consumed from the non-rechargeable battery over the second period of time. The operations management application determines whether the power system state is a normal state, a first level of degraded state, or a second level of degraded state based on whether the first amount of time exceeds the first threshold amount of time and whether the second amount of time exceeds the second threshold amount of time.

At step 206, the operations management application receives cellular connection status information. For example, operations management application 110 receives cellular connection status 102. In some embodiments, the cellular connection status information includes, for each cellular connection, a cellular link quality value indicating a quality of the cellular connection.

In some embodiments, the cellular connection status information includes, for each cellular connection, one or more properties of the connection, such as a signal strength, a signal-to-noise ratio, a bit-error ratio, a connection speed, and/or the like. The operations management application computes a cellular link quality value for each connection based on the one or more properties associated with the connection.

At step 208, the operations management application determines a cellular connection state based on the cellular connection status information. For example, operations management application 110 determines a cellular state 114 based on cellular connection status 102. Determining a cellular state is performed in a manner similar to that described above with respect to status evaluation module 112 and cellular state 114.

In some embodiments, the operations management application determines a cellular connection state based on one or more cellular link quality values specified by or computed based on the cellular connection status information. The operations management application determines, for each of the cellular link quality values, whether the cellular link quality value is above a threshold value associated with a normal state, below the threshold value associated with the normal state but above a threshold value associated with a first level of degraded state, or below the threshold value associated with the first level of degraded state.

At step 210, the operations management application receives LAN connection status information. For example, operations management application 110 receives LAN connection status 106. In some embodiments, the LAN connection status information includes information indicating a number of computing devices connected to the computing device. Additionally, in some embodiments, the LAN connection status information includes, for each connection to another computing device, a LAN connection quality value indicating a quality of the LAN connection.

In some embodiments, the LAN connection status information includes, for each connection to another computing device, one or more properties of the connection, such as a signal strength, a message transmission success rate, a number of messages or packets transmitted within a given time period, a number of messages or packets received within a given time period, and/or the like. Operations management application 110 computes a LAN connection quality value for the connection based on the one or more properties.

At step 212, the operations management application determines a LAN connection state based on the LAN connection status information. For example, operations management application 110 determines a LAN state 118 based on LAN connection status 106. Determining a cellular state is performed in a manner similar to that described above with respect to status evaluation module 112 and LAN state 118.

In some embodiments, the operations management application determines a LAN connection state based on one or more LAN connection quality values included in or computed based on the LAN connection status information. The operations management application determines, for each of the LAN connection quality values, whether the LAN connection quality value is above a threshold value associated with a normal state, below the threshold value associated with the normal state but above a threshold value associated with a first level of degraded state, or below the threshold value associated with the first level of degraded state.

In some embodiments, the operations management application determines a LAN connection state based on the number of computing devices connected via the one or more LAN connections. The operations management application determines a number of computing devices currently connected via one or more LAN connections. The operations management application compares the number of currently connected computing devices with a previous number of connected computing devices. If the number of currently connected computing devices is smaller than the number of previously connected computing devices, the operations management application determines whether the difference is below a first threshold value associated with a normal state, above the threshold value associated with the normal state but below a threshold value associated with a first level of degraded state, or above the threshold value associated with the first level of degraded state.

At step 214, the operations management application determines whether to change to a different operating state based on the power system state, the cellular connection state, and the LAN connection state. For example, operations management application 110 determines whether computing device 100 should change to a different operating state. Determining whether to change to a different operating state is performed in a manner similar to that described above with respect to decision module 120.

In some embodiments, operations management application 110 determines a target operating state for the computing device. In various embodiments, the target operating state is one of a normal operating state, a reduced operating state, or a suspended operating state based on the power system state, the cellular connection state, and the LAN connection state. Additionally, operations management application 110 determines a current operating state of the computing device.

In some embodiments, if the current operating state is the same as the target operating state, then operations management application 110 determines that the operating state should not change. If the current operating state is different from the target operating state, then operations management application 110 determines that the operating state should be changed to the target operating state.

If the operations management application determines that the operating state of the computing device should be changed to a different operating state, then at step 216, the operations management application changes the operating state of the computing device to the different operating state.

If the current operating state is a normal operating state, then changing to a reduced operating state includes reducing one or more operations or functions of the computing device. Similarly, changing to a suspended operating state includes suspending one or more operations or functions of the computing device. In some embodiments, the operations management application determines one or more device components (e.g., power system, cellular connections, LAN connections) whose state caused the decision to change operating states. Operations management application reduces or suspends one or more operations or functions associated with the one or more device components.

If the current operating state is a reduced operating state, then changing to a normal operating state includes increasing one or more previously-reduced operations or functions of the computing device. Similarly, if the current operating state is a suspended operating state, then changing to a normal operating state includes resuming normal operation of one or more previously-suspended operations or functions of the computing device. If the current operating state is a suspended operating state, then changing to a reduced operating state includes resuming one or more previously-suspended operations or functions of the computing device at a reduced level of operation or functionality.

Optionally, if the operations management application determines that the operating state of the computing device should not be changed, or after the operating state of the computing device is changed to the different operating state, the method 200 returns to step 202. In some embodiments, the method 200 is repeated periodically during operation of the computing device, e.g., every given number of hours, every day or number of days, every week, and/or the like As shown in FIG. 2, steps 202-212 are performed in order. However, in some embodiments, one or more of the steps can be performed in a different order and/or performed in parallel. For example, steps 206-208 could be performed before steps 202-204 and/or after steps 210-212. As another example, steps 202-204, 206-208, and 210-212 could be performed in parallel. In some embodiments, one or more of the steps can be omitted. For example, steps 206-208 can be omitted if the computing device does not include any cellular connections and steps 210-212 can be omitted if the computing device does not include any LAN connections to other computing devices.

FIG. 3 is flow diagram of method steps 300 for determining a target operating state, according to various embodiments. Although the method steps are described with reference to the computing device of FIG. 1, persons skilled in the art will understand that any system configured to implement the method steps, in any order, falls within the scope of the present invention.

As shown in FIG. 3, method 300 begins at step 302, where the operations management application determines determine whether any device component states are at a second level of degradation. For example, operations management application 110 determines whether any of cellular state 114, power state 116, and LAN state 118 are at a second level of degradation.

If any device component states are at a second level of degradation, then at step 304, the operations management application determines that the computing device should operate in a suspended operating state.

If no device component state is at a second level of degradation, at step 306, the operations management application determines whether any device component states are at a first level of degradation. For example, operations management application 110 determines whether any of cellular state 114, power state 116, and LAN state 118 are at a first level of degradation.

If any device component state is at a first level of degradation, then at step 308, the operations management application determines a number of device component states that are at a first level of degradation.

If multiple device component states are at a first level of degradation, then method 300 proceeds to step 304, where the operations management application determines that the computing device should operate in a suspended operating state.

If a single device component state is at a first level of degradation, then at step 310, the operations management application determines that the device should operate in a reduced operating state.

If no device component state is at a first level of degradation, then at step 312, the operations management application determines that the device should operate in a normal operating state.

Example Node

Figure 4:
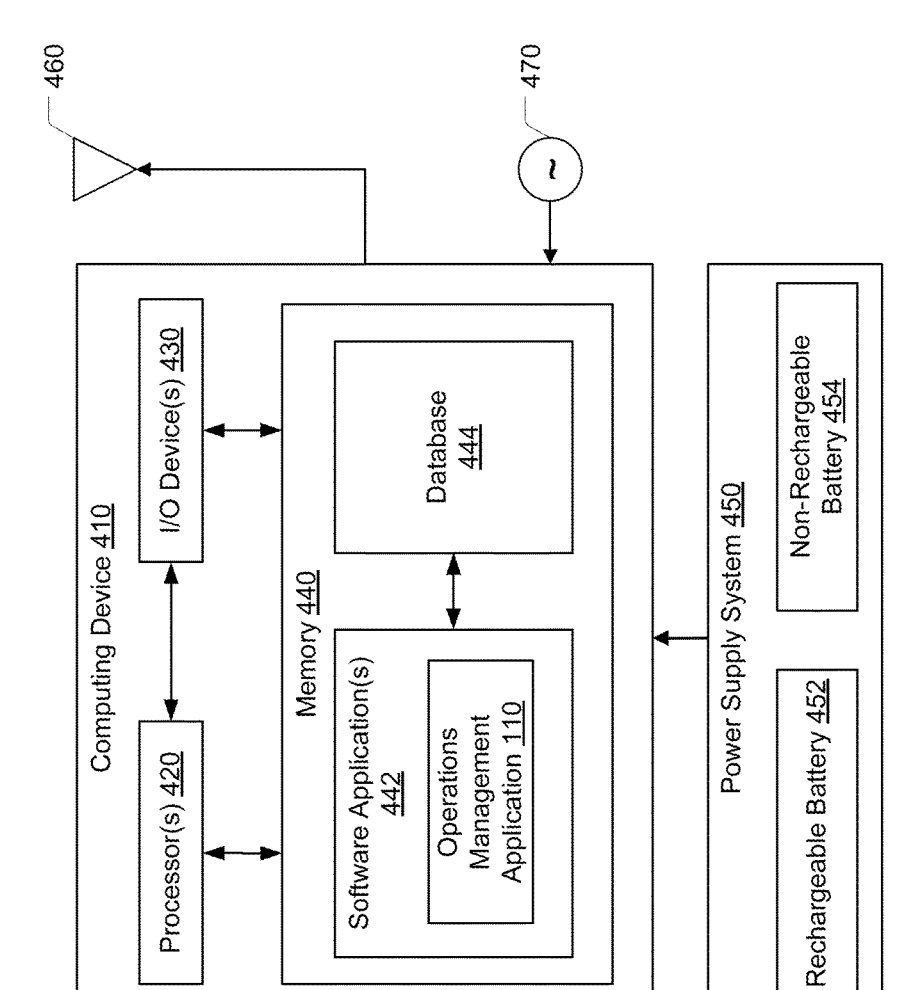
FIG. 4 illustrates an exemplary node that can be included in a network system and used to implement the techniques discussed above with respect to FIGS. 1-3.

FIG. 4 illustrates an exemplary node that can be included in a network system and used to implement the techniques discussed above with respect to FIGS. 1-3. The node 400 is a network device and includes computing device hardware configured to perform various processing operations and execute program code.

As shown, a node such as a BPD node, border router node, network gateway, cellular base station, and/or the like, includes, without limitation, a computing device 410 coupled to one or more transceivers 460 and an oscillator 470. Computing device 410 coordinates the operations of the node. Transceivers 460 are configured to transmit and receive data packets across a network system using a range of channels and power levels. Each transceiver includes one or more radios implemented in hardware and/or software to provide RF communications with other nodes in a network via one or more communication links. A transceiver can also, or instead, include a cellular modem that is used to transmit data to and receive data from a cellular base station via a corresponding link.

Oscillator 470 provides one or more oscillation signals according to which the transmission and reception of data packets can be scheduled. The node 400 can further include various analog-to-digital and digital-to-analog converters, digital signal processors (DSPs), harmonic oscillators, transceivers, and any other components generally associated with RF-based communication hardware.

Each node 400 includes computing device hardware configured to perform processing operations and execute program code. As shown, computing device 410 includes one or more processors 420, one or more input/output (I/O) devices 430, and memory 440, coupled together. Processor 420 can include any hardware configured to process data and execute software applications. In general, processor 420 retrieves and executes programming instructions stored in memory 440. The one or more I/O devices 430 include devices configured to receive input, devices configured to provide output, and devices configured to both receive input and provide output.

As shown in FIG. 4, the node 400 includes a power system 450 that supplies power to the various computing device hardware included in node 400. The power system 450 includes a rechargeable battery 452 and a non-rechargeable battery 454. Power system 450 is configured to supply power to node 400 primarily from the rechargeable battery 452. If the rechargeable battery 452 becomes depleted, then power system 450 switches to supplying power to node 400 from the non-rechargeable battery 454. In various embodiments, the power supply system 450 further includes a solar panel (not shown) or other suitable energy source. Power supply system 450 can use the energy harvested by the solar panel to provide power to node 400 and/or to charge the rechargeable battery 452. In some embodiments, if the energy harvested by the solar panel exceeds the energy consumed by node 400, power supply system 450 stores the excess harvested energy in rechargeable battery 452. If the energy consumed by node 400 exceeds the energy harvested by the solar panel, then power supply system 450 also provides power to node 400 from the rechargeable battery 452.

The one or more processors 420 can be any technically-feasible processing device configured to process data and execute program instructions. For example, the one or more processors 420 could include one or more central processing units (CPUs), DSPs, graphics processing units (GPUs), application-specific integrated circuits (ASICs), field-programmable gate arrays (FPGAs), microprocessors, microcontrollers, other types of processing units, and/or a combination of different processing units. In some embodiments, the one or more processors are coupled to a real-time clock (RTC) (not shown), according to which the one or more processors maintain an estimate of the current time.

Memory 440 includes one or more units that store data and/or program instructions. Memory 440 can be implemented by any technically-feasible storage medium. For example, memory 440 could include a random-access memory (RAM) module, a flash memory unit, and/or other type of memory unit. The one or more processors 420, one or more transceivers 460, and/or other components of node 400 include functionality to read data from and write data to memory 440. As shown, memory 440 stores one or more software applications 442 (such as operations management application 110) and database 444. The one or more software applications 442 include program instructions that, when executed by the one or more processors 420, perform any one or more of the computer-based techniques described herein.

In some embodiments, one or more software applications 442 interface with the one or more transceivers 460 and the power system 450 to determine status information related to the one or more transceivers 460 and the power system 450. For example, the one or more software applications 442 can interface with the one or more transceivers 460 to determine the status of communication links to other nodes and/or a communication link to a cellular base station. As another example, the one or more software applications 442 can interface with the power system 450 to determine the status of the rechargeable battery 452, the status of the non-rechargeable battery 454, and/or the status of a solar panel or other energy source. Operations management application 110 determines the status information related to the one or more transceivers 460 and the power system 450 and/or receives the status information from one or more other software applications 442, and determines whether to change operation of the node 400 from a current operating state to a different operating state, such as a reduced operating state or suspended operating state.

In some embodiments, the one or more software applications 442 interface with the one or more transceivers 460 to coordinate the transmission and reception of message data packets and/or periodic beacons across a network system based on timing signals generated by the oscillator 470. Additionally, if operations management application 110 determines that the current operating state of the node 400 should be changed to a reduced or suspended operating state, one or more of the software applications 442 interface with the one or more transceivers 460 to reduce or suspend the amount or rate of transmission and/or reception of message data packets and/or periodic beacons across the network system.

Database 444 includes various data and data structures retrieved by and/or stored by the one or more software applications 442. For example, database 444 could store data indicating threshold values for determining state levels when evaluating cellular signal status, power system status, and/or LAN connection status. As another example, database 444 could store collected status information and/or metrics for determining state levels when evaluating cellular signal status, power system status, and/or LAN connection status, such as the amount of battery life remaining for rechargeable battery 452 at a given time, the amount of battery life remaining for non-rechargeable battery 454 at a given time, the number of nodes connected to the node 400 at a given time, an amount of time that power system 450 utilized only non-rechargeable battery 454, an amount of time that power system 450 utilized only rechargeable battery 452, an amount of time since node 400 entered a reduced or suspended operating state, an average number of nodes connected to node 400 during a period of time, and/or the like.

System Overview

Figure 5:
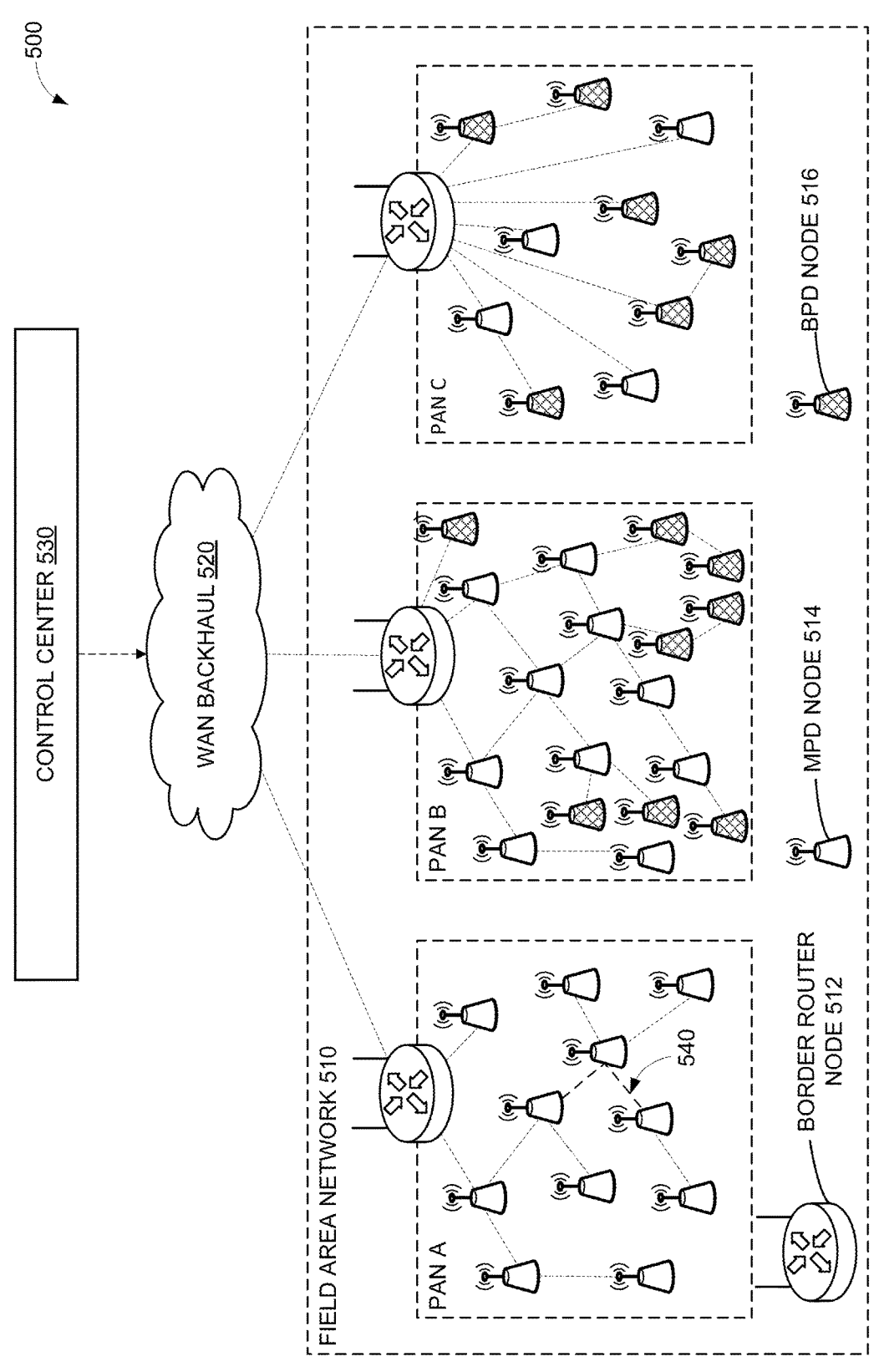
FIG. 5 illustrates a network system configured to implement one or more aspects of the present embodiments.

FIG. 5 illustrates a network system configured to implement one or more aspects of the present embodiments. As shown, network system 500 includes a field area network (FAN) 510, a wide area network (WAN) backhaul 520, and a control center 530. FAN 510 is coupled to control center 530 via WAN backhaul 520. Control center 530 is configured to coordinate the operation of FAN 510.

FAN 510 includes personal area network (PANs) A, B, and C. PANs A and B are organized according to a mesh network topology, while PAN C is organized according to a star network topology. Each of PANs A, B, and C includes at least one border router node 512 and one or more mains-powered device (MPD) nodes 514. PANs B and C further include one or more battery-powered device (BPD) nodes 516. Any of border router node 512, the one or more MPD nodes 514, or the BPD nodes 516 can be used to implement the techniques discussed above with respect to FIGS. 1-4.

MPD nodes 514 draw power from an external power source, such as mains electricity or a power grid. MPD nodes 514 typically operate on a continuous basis without powering down for extended periods of time. BPD nodes 516 draw power from an internal power source, such as a battery. BPD nodes 516 typically operate intermittently and power down, go to very low power mode, for extended periods of time in order to conserve battery power.

MPD nodes 514 and BPD nodes 516 are coupled to, or included within, a utility distribution infrastructure (not shown) that distributes a resource to consumers. MPD nodes 514 and BPD nodes 516 gather sensor data related to the distribution of the resource, process the sensor data, and communicate processing results and other information to control center 530. Border router nodes 512 operate as access points to provide MPD nodes 514 and BPD nodes 516 with access to control center 530.

Any of border router nodes 512, MPD nodes 514, and BPD nodes 516 are configured to communicate directly with one or more adjacent nodes via bi-directional communication links, such as bi-directional communication link 540. The communication links may be wired or wireless links, although in practice, adjacent nodes of a given PAN exchange data with one another by transmitting data packets via wireless radio frequency (RF) communications. The various node types are configured to perform a technique known in the art as "channel hopping" in order to periodically receive data packets on varying channels. As known in the art, a "channel" may correspond to a particular range of frequencies. In one embodiment, a node may compute a current receive channel by evaluating a Jenkins hash function based on a total number of channels and the media access control (MAC) address of the node.

Each node within a given PAN can implement a discovery protocol to identify one or more adjacent nodes or "neighbors." A node that has identified an adjacent, neighboring node can establish a bi-directional communication link with the neighboring node. Each neighboring node may update a respective neighbor table to include information concerning the other node, including the MAC address of the other node as well as a received signal strength indication (RSSI) of the communication link established with that node.

Nodes can compute the channel hopping sequences of adjacent nodes to facilitate the successful transmission of data packets to those nodes. In embodiments where nodes implement the Jenkins hash function, a node computes a current receive channel of an adjacent node using the total number of channels, the MAC address of the adjacent node, and a time slot number assigned to a current time slot of the adjacent node.

Any of the nodes discussed above may operate as a source node, an intermediate node, or a destination node for the transmission of data packets. A given source node can generate a data packet and then transmit the data packet to a destination node via any number of intermediate nodes (in mesh network topologies). The data packet can indicate a destination for the packet and/or a particular sequence of intermediate nodes to traverse in order to reach the destination node. In one embodiment, each intermediate node can include a forwarding database indicating various network routes and cost metrics associated with each route.

Nodes can transmit data packets across a given PAN and across WAN backhaul 520 to control center 530. Similarly, control center 530 can transmit data packets across WAN backhaul 520 and across any given PAN to a particular node included therein. As a general matter, numerous routes can exist which traverse any of PANs A, B, and C and include any number of intermediate nodes, thereby allowing any given node or other component within network system 500 to communicate with any other node or component included therein.

Control center 530 includes one or more server machines (not shown) configured to operate as sources for, or destinations of, data packets that traverse within network system 500. The server machines can query nodes within network system 500 to obtain various data, including raw or processed sensor data, power consumption data, node/network throughput data, status information, and so forth. The server machines can also transmit commands and/or program instructions to any node within network system 500 to cause those nodes to perform various operations. In one embodiment, each server machine is a computing device configured to execute, via a processor, a software application stored in a memory to perform various network management operations.

In sum, an operations management application receives system information indicating the status of one or more components of a node, such as the status of a rechargeable battery, non-rechargeable battery, and one or more communication systems. The operations management application determines, based on the system information, whether each component is operating in a normal state or at various levels of degradation. Operations management application determines whether to switch to a reduced operating state or a suspended operating state based on whether the components are operating in a normal state or in a degraded state. If one component is operating in a degraded state, operations management application determines that the node should operate in a reduced operating state. The reduced operating state includes reducing operations and/or functions associated with the component that is operating in a degraded state. If multiple components are operating in a degraded state, or if a component is operating in a more severely degraded state, then operations management application determines that the node should operate in a suspended operating state. The reduced operating state includes suspending operations and/or functions associated with the components that are operating in a degraded state or the component that is operating in a severely degraded state.

At least one technical advantage of the disclosed techniques relative to the prior art is that, with the disclosed techniques, the operational life of a device powered by a non-rechargeable battery can be significantly improved. In particular, by monitoring the state of the power system and/or communication systems of the device, the device can enter into an operating state that reduces the consumption of energy stored in the rechargeable battery and thereby reduces the likelihood that the device will need to consume energy stored in the non-rechargeable battery at a later time. Accordingly, using the disclosed techniques, the consumption of energy from the non-rechargeable battery is reduced compared to prior approaches that adjust operation of the device after the non-rechargeable battery has already been consumed. These technical advantages provide one or more technological improvements over prior art approaches.

1. In some embodiments, a method comprises determining, by a first computing device powered by a rechargeable battery and a non-rechargeable battery, whether to change operation of the first computing device from a first operating state to a second operating state based on one or more of a state of the rechargeable battery, a state of the non-rechargeable battery, or a state of a communication mode of the first computing device; and in response to determining that operation of the first computing device should change to the second operating state, increasing, by the first computing device, an interval between communications with one or more second computing devices using the communication mode.

2. The method of clause 1, further comprising determining, by the first computing device, whether to change operation of the first computing device from the second operating state to the first operating state based on one or more of a state of the rechargeable battery, a state of the non-rechargeable battery, or a state of the communication mode of the first computing device; and in response to determining that operation of the first computing device should change to the first operating state, decreasing, by the first computing device, the interval between communications with the one or more second computing devices using the communication mode.

3. The method of clause 1 or 2, further comprising determining, by the first computing device, whether to change operation of the first computing device from the second operating state to a third operating state based on one or more of a state of the rechargeable battery, a state of the non-rechargeable battery, or a state of the communication mode of the first computing device; and in response to determining that operation of the first computing device should change to the third operating state, ceasing, by the first computing device, communications with the one or more second computing devices using the communication mode.

4. The method of any of clauses 1-3, wherein a state of the rechargeable battery includes an amount of energy remaining in the rechargeable battery; and a state of the non-rechargeable battery includes an amount of energy remaining in the non-rechargeable battery.

5. The method of any of clauses 1-4, wherein a state of the non-rechargeable battery includes a total amount of time within a first period of time that the first computing device consumed energy from the non-rechargeable battery.

6. The method of any of clauses 1-5, wherein a state of the communication mode is based on a respective state of a plurality of communication links using the communication mode.

7. The method of any of clauses 1-6, wherein a state of the communication mode includes a number of computing devices communicating with the first computing device using the communication mode.

8. The method of any of clauses 1-7, wherein determining whether to change operation of the first computing device from the first operating state to the second operating state comprises determining whether one or more of the state of the rechargeable battery, the state of the non-rechargeable battery, or the state of the communication mode of the first computing device is a degraded state.

9. The method of any of clauses 1-8, wherein determining whether to change operation of the first computing device from the first operating state to the second operating state comprises determining whether one or more of the state of the rechargeable battery, the state of the non-rechargeable battery, or the state of the communication mode of the first computing device is one of a normal state, a first degraded state, or a second degraded state.

10. In some embodiments, one or more non-transitory computer-readable media store instructions which, when executed by one or more processors of a first node powered by a primary power cell and a secondary power cell, cause the one or more processors to perform operations comprising determining whether to change operation of the first node from a first operating state to a second operating state based a state of one or more device components, wherein respective device components of the one or more device components are power system components or communication components of the first node; and in response to determining that operation of the first node should change to the second operating state, modifying a rate of communications with one or more second nodes.

11. The one or more non-transitory computer-readable media of clause 10, wherein modifying the rate of communications with the one or more second nodes comprises increasing an interval between communications with the one or more second nodes, decreasing an interval between communications with the one or more second nodes, or suspending communications with the one or more second nodes.

12. The one or more non-transitory computer-readable media of clause 10 or 11, wherein determining whether to change operation of the first node to the second operating state comprises determining whether the state of a respective device component of the one or more device components is one of a normal state, a first degraded state, or a second degraded state; in response to determining that the state of the respective device component is a second degraded state, determining that operation of the first node should change to the second operating state, wherein the second operating state is a suspended operating state.

13. The one or more non-transitory computer-readable media of any of clauses 10-12, wherein the one or more device components comprises a plurality of device components; and wherein determining whether to change operation of the first node to the second operating state comprises: determining whether respective states for the plurality of device components is one of a normal state, a first degraded state, or a second degraded state; in response to determining that more than one respective state of the plurality of device component is a first degraded state, determining that operation of the first node should change to the second operating state, wherein the second operating state is a suspended operating state.

14. The one or more non-transitory computer-readable media of any of clauses 10-13, wherein determining whether to change operation of the first node to the second operating state comprises determining whether the state of a respective device component of the one or more device components is one of a normal state, a first degraded state, or a second degraded state; in response to determining that the state of the respective device component is a first degraded state, determining that operation of the first node should change to the second operating state, wherein the second operating state is a reduced operating state.

15. The one or more non-transitory computer-readable media of any of clauses 10-14, wherein modifying the rate of communications with the one or more second nodes comprises increasing the rate of communications with the one or more second nodes.

16. The one or more non-transitory computer-readable media of any of clauses 10-15, wherein the communications with the one or more second nodes are performed via one or more cellular connections or one or more local area network (LAN) connections.

17. In some embodiments, a network device comprises a power system comprising a rechargeable battery and a non-rechargeable battery; a processor; and a memory storing executable instructions that when executed by the processor cause the network device to determine whether to change operation of the network device from a first operating state to a second operating state based on a state of the power system; and in response to determining that operation of the first computing device should change to the second operating state, increasing an interval between communications with one or more second computing devices.

18. The network device of clause 17, wherein the power system further comprises a solar panel, wherein the state of the power system includes one or more of a state of the rechargeable battery, a state of the non-rechargeable battery, or a state of the solar panel.

19. The network device of clause 17 or 18, wherein the state of the solar panel includes whether the solar panel is supplying energy to the network device.

20. The network device of any of clauses 17-19, wherein the state of the solar panel includes an amount of time that the solar panel has been inactive.

Any and all combinations of any of the claim elements recited in any of the claims and/or any elements described in this application, in any fashion, fall within the contemplated scope of the present invention and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "module," a "system," or a "computer." In addition, any hardware and/or software technique, process, function, component, engine, module, or system described in the present disclosure may be implemented as a circuit or set of circuits. Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general-purpose computer, special purpose computer, or other programmable data processing apparatus to produce a machine. The instructions, when executed via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A method comprising:

determining, by a first computing device powered by a rechargeable battery and a non-rechargeable battery, a count of a number of different types of component states that are in a first level of degradation of a plurality of levels of degradation for a respective type of component state, the types of component states being selected from a group consisting of: a state of the rechargeable battery, a state of the non-rechargeable battery, and a state of a communication mode of the first computing device;

determining, by the first computing device, whether to change operation of the first computing device from a first operating state to a second operating state based on the count; and in response to determining that operation of the first computing device should change to the second operating state, increasing, by the first computing device, an interval between communications with one or more second computing devices using the communication mode.

2. The method of claim 1, further comprising:

determining, by the first computing device, whether to change operation of the first computing device from the second operating state to the first operating state based on one or more of the state of the rechargeable battery, the state of the non-rechargeable battery, or the state of the communication mode of the first computing device; and in response to determining that operation of the first computing device should change to the first operating state, decreasing, by the first computing device, the interval between communications with the one or more second computing devices using the communication mode.

3. The method of claim 1, further comprising:

determining, by the first computing device, whether to change operation of the first computing device from the second operating state to a third operating state based on one or more of the state of the rechargeable battery, the state of the non-rechargeable battery, or the state of the communication mode of the first computing device; and in response to determining that operation of the first computing device should change to the third operating state, ceasing, by the first computing device, communications with the one or more second computing devices using the communication mode.

4. The method of claim 1, wherein:

the state of the rechargeable battery includes an amount of energy remaining in the rechargeable battery; and the state of the non-rechargeable battery includes an amount of energy remaining in the non-rechargeable battery.

5. The method of claim 1, wherein the state of the non-rechargeable battery includes a total amount of time within a first period of time that the first computing device consumed energy from the non-rechargeable battery.

6. The method of claim 1, wherein the state of the communication mode is based on a respective state of a plurality of communication links using the communication mode.

7. The method of claim 1, wherein the state of the communication mode includes a number of computing devices communicating with the first computing device using the communication mode.

8. The method of claim 1, wherein determining whether to change operation of the first computing device from the first operating state to the second operating state comprises determining whether one or more of the state of the rechargeable battery, the state of the non-rechargeable battery, or the state of the communication mode of the first computing device is a degraded state.

9. The method of claim 1, wherein determining whether to change operation of the first computing device from the first operating state to the second operating state comprises determining whether one or more of the state of the rechargeable battery, the state of the non-rechargeable battery, or the state of the communication mode of the first computing device is one of a normal state, a first degraded state, or a second degraded state.

10. One or more non-transitory computer-readable media storing instructions which, when executed by one or more processors of a first node powered by a primary power cell and a secondary power cell, cause the one or more processors to perform operations comprising:

determining a count of a number of different types of states of one or more device components in a first level of degradation of a plurality of levels of degradation for a respective type of component state, wherein respective device components of the one or more device components are selected from a group consisting of power system components and communication components of the first node;

determining whether to change operation of the first node from a first operating state to a second operating state based on the count; and in response to determining that operation of the first node should change to the second operating state, modifying a rate of communications with one or more second nodes.

11. The one or more non-transitory computer-readable media of claim 10, wherein modifying the rate of communications with the one or more second nodes comprises increasing an interval between communications with the one or more second nodes, decreasing an interval between communications with the one or more second nodes, or suspending communications with the one or more second nodes.

12. The one or more non-transitory computer-readable media of claim 10, wherein determining whether to change operation of the first node to the second operating state comprises:

determining whether a state of a respective device component of the one or more device components is one of a normal state, the first level of degradation, or a second level of degradation; and in response to determining that the state of the respective device component is a second level of degradation, determining that operation of the first node should change to the second operating state, wherein the second operating state is a suspended operating state.

13. The one or more non-transitory computer-readable media of claim 10, wherein the one or more device components comprises a plurality of device components; and wherein determining whether to change operation of the first node to the second operating state comprises:

determining whether respective states for the plurality of device components is one of a normal state, the first level of degradation, or a second level of degradation; and in response to determining that the count of the number of different types of states is greater than one, determining that operation of the first node should change to the second operating state, wherein the second operating state is a suspended operating state.

14. The one or more non-transitory computer-readable media of claim 10, wherein determining whether to change operation of the first node to the second operating state comprises:

determining whether a state of a respective device component of the one or more device components is one of a normal state, a first degraded state, or a second degraded state; and in response to determining that the state of the respective device component is a first degraded state, determining that operation of the first node should change to the second operating state, wherein the second operating state is a reduced operating state.

15. The one or more non-transitory computer-readable media of claim 10, wherein modifying the rate of communications with the one or more second nodes comprises increasing the rate of communications with the one or more second nodes.

16. The one or more non-transitory computer-readable media of claim 10 wherein the communications with the one or more second nodes are performed via one or more cellular connections or one or more local area network (LAN) connections.

17. A network device comprising:

a power system comprising a rechargeable battery and a non-rechargeable battery;

a processor; and a memory storing executable instructions that when executed by the processor cause the network device to:

determine a count of a number of different types of component states in a first level of degradation of a plurality of levels of degradation, the component states comprising one or more states of the power system;

determine whether to change operation of the network device from a first operating state to a second operating state based on the count; and in response to determining that operation of the network device should change to the second operating state, increasing an interval between communications with one or more second computing devices.

18. The network device of claim 17, wherein the power system further comprises a solar panel, wherein the one or more states of the power system includes one or more of a state of the rechargeable battery, a state of the non-rechargeable battery, or a state of the solar panel.

19. The network device of claim 18, wherein the state of the solar panel includes whether the solar panel is supplying energy to the network device.

20. The network device of claim 18, wherein the state of the solar panel includes an amount of time that the solar panel has been inactive.

\* \* \* \* \*